United States Patent [19]
Krishnamurthy et al.

[11] Patent Number: 5,986,473
[45] Date of Patent: Nov. 16, 1999

[54] DIFFERENTIAL, MIXED SWING, TRISTATE DRIVER CIRCUIT FOR HIGH PERFORMANCE AND LOW POWER ON-CHIP INTERCONNECTS

[75] Inventors: Ram Kumar Krishnamurthy; Vivek De, both of Hillsboro; Krishnamurthy Soumyanath, Portland, all of Oreg.

[73] Assignee: Intel Corporation, Santa Clara, Calif.

[21] Appl. No.: 09/001,449

[22] Filed: Dec. 31, 1997

[51] Int. Cl.$^6$ .............................................. H03K 19/0185
[52] U.S. Cl. ................................ 326/83; 326/86; 326/56; 327/391
[58] Field of Search ..................................... 327/534, 535, 327/391; 326/56, 57, 80, 82, 83, 86, 112, 17, 34

[56] References Cited

U.S. PATENT DOCUMENTS

| | | | |
|---|---|---|---|
| 5,461,338 | 10/1995 | Hirayama et al. | 327/534 |
| 5,491,432 | 2/1996 | Wong et al. | 326/86 |
| 5,594,696 | 1/1997 | Komarek et al. | 327/52 |
| 5,656,970 | 8/1997 | Campbell et al. | 327/534 |
| 5,661,414 | 8/1997 | Shigehara et al. | 326/81 |
| 5,821,805 | 10/1998 | Jinbo | 326/535 |

OTHER PUBLICATIONS

"Sub–1–V Swing Internal Bus Architecture For Future Low–Power ULSI's", Nakagome, et al., IEEE Journal of Solid–State Circuits, vol. 28, No. 4, Apr. 1993.

Exploring the Design Space of Mixed Swing QuadRail for Low–Power Digital Circuit, Krishnamurthy, et al., IEEE Transactions On Very Large Scale Integration, vol. 5, No. 4, Dec. 1997.

*Primary Examiner*—Michael Tokar
*Assistant Examiner*—Don Phu Le
*Attorney, Agent, or Firm*—Seth Z. Kalson

[57] ABSTRACT

A driver to provide low voltage swings on a bus with fast switching times, the driver comprising two pairs of pullup and pulldown nMOSFETs, each pair operated in complementary fashion to each other, each pair with a high voltage rail at a smaller voltage than the data input logic HIGH voltage, and where each substrate of the nMOSFETs are biased so as to reduce their threshold voltages.

9 Claims, 3 Drawing Sheets

DIFFERENTIAL, MIXED SWING, TRISTATE DRIVER CIRCUIT FOR HIGH PERFORMANCE AND LOW POWER ON-CHIP INTERCONNECTS

FIELD OF INVENTION

The present invention relates to drivers for buses, and more particularly to low swing, high performance and low power differential CMOS trisate drivers.

BACKGROUND

Rapidly increasing circuit integration density, coupled with accompanying on-die heat dissipation problems, has motivated strong interest in exploring low power and low voltage circuit methodologies, while retaining high performance. In particular, long point-to-point interconnects between and within microprocessor datapath functional unit blocks have become, with increased integration, major on-chip performance and power bottlenecks. This is primarily because interconnect capacitance per unit length, dominated by sidewall fringing and cross-coupling, increases hyperbolically with lateral dimensional scaling of interconnects.

Figure 1:
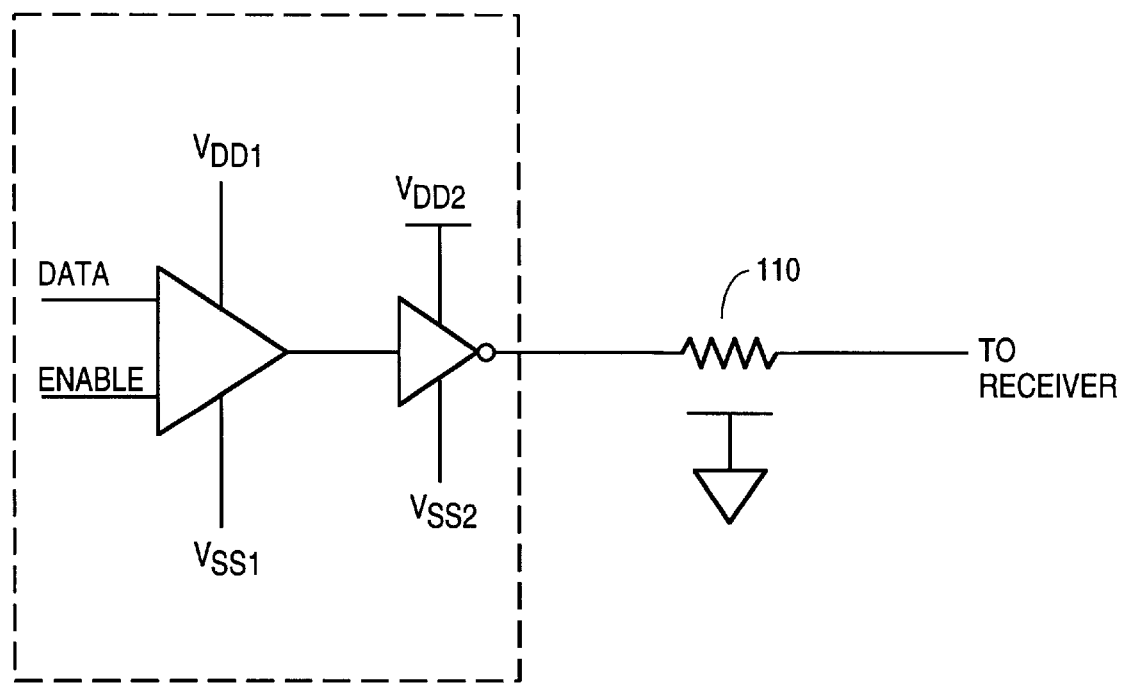
FIG. 1 illustrates a prior art low swing CMOS driver.

Mixed (multiple) voltage swing based CMOS circuit techniques have been studied previously for high performance and low power on-chip datapath interconnects. See "Sub 1V Swing Internal Bus Architecture for Future Low Power ULSI's", Y. Nakagome, et al., IEEE Journal of Solid State Circuits, April 1993, pp. 414–419; and "Exploring the Design Space of Mixed Swing QuadRail for Low Power Digital Circuits", R. K. Krishnamurthy and L. R. Carley, to appear in IEEE Trans. on VLSI Systems, September 1997. FIG. 1 illustrates the general principle behind these approaches. Essentially, the voltage swings across long interconnects, such as bus line 110, are suppressed by employing an additional pair of power supply rails ($V_{dd2}$ and $V_{SS2}$). For a given $V_{dd2}$ and $V_{SS2}$, reducing the low voltage swing $V_{dd2}$-$V_{SS2}$ offers a nearly linear to quadratic reduction in interconnect power depending upon how the additional pair of power rails are generated.

Dynamic drivers, which cause voltage swings even if their input data remains constant, have generally much larger switching activity than static drivers and thus consume more power. It is therefore advantageous to provide static drivers with low voltage swings, but which have faster switching times than prior art static drivers and which provide less unwanted power dissipation than prior art dynamic drivers. It is also advantageous to provide drivers that require only three power rails (one rail to provide a LOW voltage and the other two rails to provide first and second HIGH voltages).

DETAILED DESCRIPTION OF EMBODIMENTS

Figure 2:
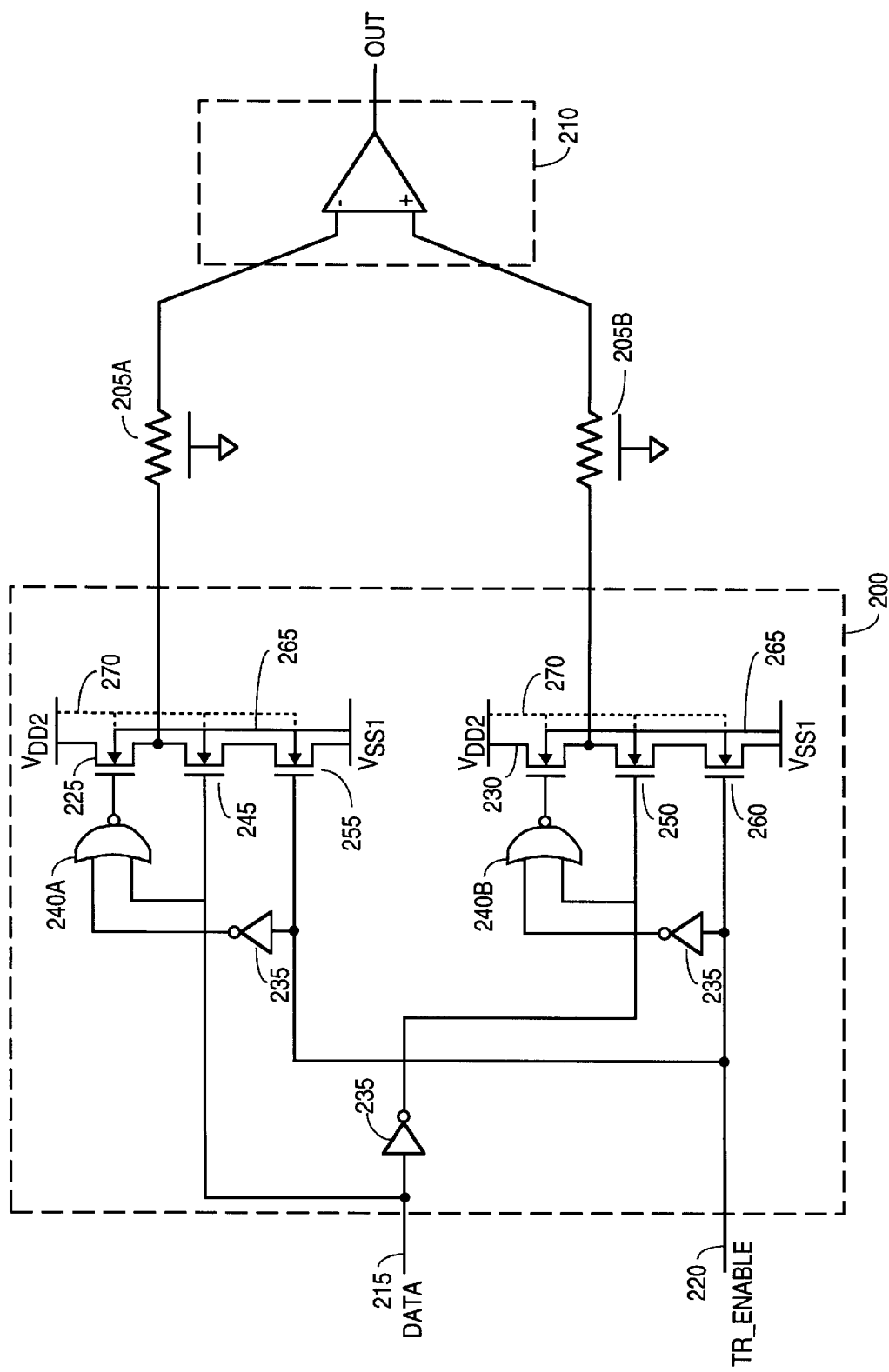
FIG. 2 illustrates an embodiment of a low swing, high performance and low power differential CMOS driver with tristate capabilities.

FIG. 2 illustrates driver 200 providing complementary output signals on interconnect or bus lines 205 to receiver 210 in response to a digital input voltage signal at terminal 215. Receiver 210 is modeled as a low-to-high differential sense amplifier. Driving bus lines 205 with complementary output signals, along with differencing the output signals by receiver 210, allows for large common mode noise rejection, and consequently improved noise immunity. An enable signal is applied to terminal 220 so that driver 200 can be tristated (i.e., provides a high impedance to bus lines 205) when the enable signal is LOW ($V_{ss1}$).

Consider the case in which terminal 220 is held HIGH. Pullup nMOSFET 225 drives bus line 205a to a voltage min{$V_{dd2}$-$V_{DS}$, $V_{dd1}$-$V_{th}$} when ON, where $V_{dd1}$ is the full swing supply voltage applied to the gate of nMOSFET 225 when NOR gate 240a is providing a HIGH logic level, $V_{th}$ is the threshold voltage of nMOSFET 225, and $V_{DS}$ is the drain-to-source voltage drop of nMOSFET 225 when ON. For most practical cases, $V_{DS}$ can be ignored. However, when nMOSFET 225 is being driven ON, because of inverter 235, pulldown nMOSFET 250 is driven ON, which drives bus line 205b to voltage $V_{SS1}$.

Because of NOR gates 240a and 240b, nMOSFETs 225 and 245 are switched in complementary fashion respect to each other and nMOSFETs 230 and 250 are in switched in complementary fashion with respect to each other. Because of inverter 235, nMOSFETs 225 and 230 are switched in complementary fashion with respect to each other and nMOSFETs 245 and 250 are switched in complementary fashion with respect to each other. Consequently, when nMOSFET 225 is ON, nMOSFET 245 is OFF, nMOSFET 230 is OFF, nMOSFET 250 is ON, bus line 205a is driven to min{$V_{dd2}$-$V_{DS}$, $V_{dd1}$-$V_{th}$}, and bus line 205b is driven to $V_{ss1}$. Also, when nMOSFET 225 is OFF, nMOSFET 245 is ON, nMOSFET 230 is ON, nMOSFET 250 is OFF, bus line 205a is driven to $V_{ss1}$, and bus line 205b is driven to min{$V_{dd2}$-$V_{DS}$, $V_{dd1}$-$V_{th}$}. (For simplicity of discussion only, we assume that all shown nMOSFETs have the same threshold voltages and the same drain-to-source voltage drops when ON.)

For the case in which terminal 220 is held LOW, pullup nMOSFETs 225 and 230 are OFF, and pulldown nMOSFETs 255 and 260 are OFF, so that driver 200 provides a high impedance to bus lines 205a and 205b from the rails providing $V_{ss1}$ and $V_{dd2}$.

The digital input voltage signal will have a data-high voltage when in its HIGH state and a data-low voltage when in its LOW state. The voltage $V_{dd2}$ is chosen to be less than the data-high voltage. In a preferred embodiment, $V_{ss1}$ will be equal to the data-low voltage so that driver 200 requires only three power rails. Note that other embodiments may be realized in which the drain voltages of nMOSFETs 225 and 230 may be different from each other. Similarly for the source voltages of nMOSFETs 255 and 260.

In the particular embodiment shown in FIG. 2, solid lines 265 indicate that the substrates of the shown nMOSFETs may be biased to voltage $V_{ss1}$. However, provided $V_{dd2}$ is not much greater than 500 mV+$V_{ss1}$, the substrates may be biased to voltage $V_{dd2}$, as indicated by dashed lines 270. By biasing the substrates at a voltage above $V_{ss1}$, the p-n junctions within the shown nMOSFETs are slightly forward biased. This decreases the threshold voltages of the shown nMOSFETs. With decreased threshold voltages, the shown nMOSFETs source or sink larger currents for the same gate-source voltages, which allows driver 200 to drive bus lines 205 faster.

In other embodiments, the substrates of the shown nMOSFETs may be biased to voltages other than $V_{dd2}$ and $V_{ss1}$ by a bias circuit. Also, other means may be employed to reduce the threshold voltages, such as channel ion-implantation.

Figure 3:
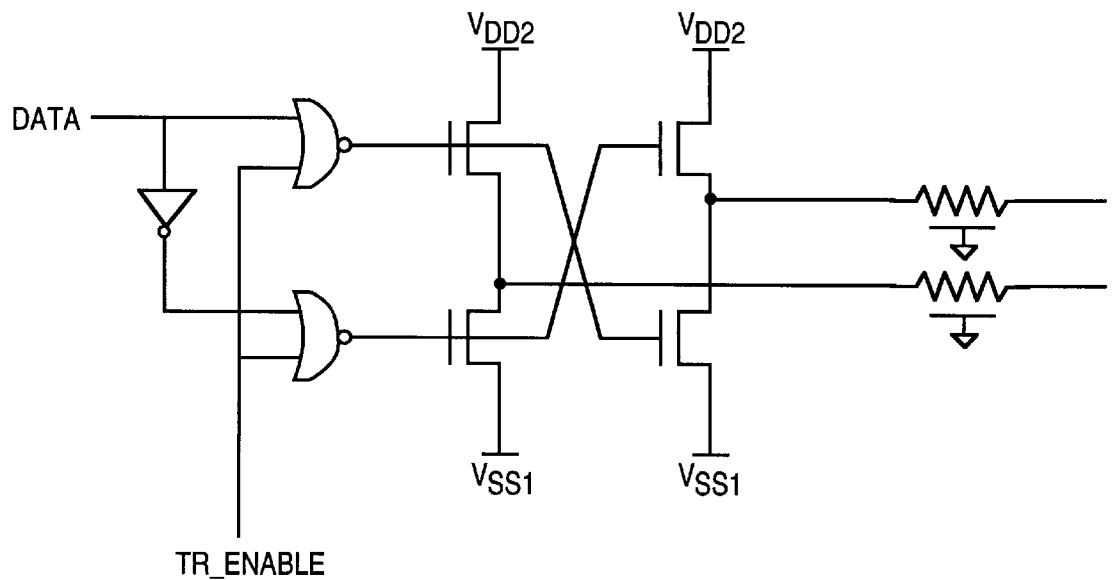
FIG. 3 illustrates another embodiment of a low swing, high performance and low power differential CMOS driver with tristate capabilities.

Another embodiment driver 300 is shown in FIG. 3. The operation of driver 300 is similar to that of driver 200, except that only four nMOSFETs rather than six nMOSFETs need be sized for driving bus lines 205*a* and 205*b*.

Other embodiments may be realized without departing from the scope of the invention as claimed below.

What is claimed is:

1. A driver comprising: an input terminal to receive a digital input signal;
   a first output terminal;
   a first pullup nMOSFET having a source connected to the first output terminal, a drain connected to a voltage supply rail, and a substrate connected to the voltage supply rail, wherein the voltage supply rail is to provide a voltage $V_{dd}$ above ground potential; and
   a first data-driven pulldown nMOSFET having a source, a drain connected to the first output terminal, and a substrate connected to the voltage supply rail;
   wherein the first pullup nMOSFET and the first data-driven nMOSFET are coupled to the input terminal to be switched ON and OFF in complementary fashion with respect to each other in response to the digital input signal.

2. The driver as set forth in claim 1, wherein the first data-driven pulldown nMOSFET drives the output terminal to ground potential only if ON.

3. The driver as set forth in claim 1, wherein the input digital signal has a voltage range greater than $V_{dd}$.

4. The driver as set forth in claim 1, further comprising:
   an enable terminal; and
   a first pulldown nMOSFET having a source connected to ground, a drain connected to the source of the first data-driven pulldown nMOSFET, and a substrate connected to the voltage supply rail, wherein the first pulldown nMOSFET and the first pullup nMOSFET are coupled to the enable terminal so as to tri-state the driver if the enable terminal is in one of two logic states.

5. The driver as set forth in claim 1, further comprising:
   a second output terminal;
   a second pullup nMOSFET having a source connected to the second output terminal, a drain connected to the voltage supply rail, and a substrate connected to the voltage supply rail; and
   a second data-driven pulldown nMOSFET having a source, a drain connected to the second output terminal, and a substrate connected to the voltage supply rail;
   wherein the second pullup nMOSFET and the second data-driven nMOSFET are coupled to the input terminal to be switched ON and OFF in complementary fashion with respect to each other in response to the digital input signal, and so that the first and second pullup nMOSFETs are to be switched ON and OFF in complementary fashion with respect to each other in response to the digital input signal.

6. The driver as set forth in claim 4, further comprising:
   a second output terminal;
   a second pullup nMOSFET having a source connected to the second output terminal, a drain connected to the voltage supply rail, and a substrate connected to the voltage supply rail;
   a second data-driven pulldown nMOSFET having a source, a drain connected to the second output terminal, and a substrate connected to the voltage supply rail; and
   a second pulldown nMOSFET having a source connected to ground, a substrate connected to the voltage supply rail, and a drain connected to the source of the second data-driven pulldown nMOSFET;
   wherein the second pullup nMOSFET and the second pulldown nMOSFET are coupled to the enable terminal to tri-state the driver if the enable terminal is in one of two logic states;
   wherein the second pullup nMOSFET and the second data-driven nMOSFET are coupled to the input terminal to be switched ON and OFF in complementary fashion with respect to each other in response to the digital input signal, and so that the first and second pullup nMOSFETs are to be switched ON and OFF in complementary fashion with respect to each other in response to the digital input signal.

7. A driver having input and output terminals, the driver comprising:
   a pullup nMOSFET to provide a low impedance path from the output terminal to a voltage supply circuit providing a voltage $V_{dd}$ only if ON, and to provide a high impedance path from the output terminal to the voltage supply circuit if OFF; and
   a data-driven pulldown nMOSFET to provide a low impedance path from the output terminal to ground only if ON, and to provide a high impedance path from the output terminal to ground if OFF;
   wherein the pullup nMOSFET and the data-driven pulldown nMOSFET are coupled to the input terminal to be switched ON and OFF in complementary fashion with respect to each other in response to a digital input voltage applied to the input terminal;
   wherein the substrates of the pullup nMOSFET and the data-driven pulldown nMOSFET are coupled to the voltage supply circuit to be biased at $V_{dd}$.

8. The driver as set forth in claim 7, further comprising:
   an enable terminal; and
   a pulldown nMOSFET, having a gate, coupled to the enable terminal so that its gate has a logic state indicative of the enable terminal, and to provide a low impedance path between the output terminal and ground only if ON, and to provide a high impedance path between the output terminal and ground if OFF;
   wherein the pullup nMOSFET is coupled to the enable terminal to provide a high impedance path from the output terminal to the voltage supply circuit if the enable terminal is in one of two logic states.

9. A driver having input and output terminals, the driver comprising:
   a pullup nMOSFET to provide a low impedance path from the output terminal to a voltage supply circuit providing a drive-high voltage only if ON, and to provide a high impedance path from the output terminal to the voltage supply circuit if OFF;
   a data-driven pulldown nMOSFET to provide a low impedance path from the output terminal to ground only if ON, and to provide a high impedance path from the output terminal to ground if OFF, wherein the pullup nMOSFET and the data-driven pulldown nMOSFET are coupled to the input terminal to be switched ON and OFF in complementary fashion with respect to each other;
   a bias circuit to bias the substrates of the pullup nMOSFET and the data-driven pulldown nMOSFET higher than ground;
   an enable terminal; and a pulldown nMOSFET having a gate coupled to the enable terminal so that its gate has a logic state indicative of the enable terminal, and to provide a low impedance path between the output terminal and ground only if ON, and to provide a high impedance path between the output terminal and ground if OFF; wherein the pullup nMOSFET is coupled to the enable terminal to provide a high impedance path from the output terminal to the voltage supply circuit if the enable terminal is in one of two logic states.

* * * * *

UNITED STATES PATENT AND TRADEMARK OFFICE
CERTIFICATE OF CORRECTION

PATENT NO. : 5,986,473
DATED : November 16, 1999
INVENTOR(S) : Krishnamurthy et al.

It is certified that error appears in the above-identified patent and that said Letters Patent is hereby corrected as shown below:

<u>Title page,</u>
Item [22], PCT Filed, please delete "December 31, 1997" and insert
-- December 30, 1997 --.

Signed and Sealed this

Twenty-third Day of March, 2004

JON W. DUDAS
*Acting Director of the United States Patent and Trademark Office*